US012706604B2

(12) United States Patent
Morche et al.

(10) Patent No.: US 12,706,604 B2
(45) Date of Patent: Aug. 11, 2026

(54) NPF RADIOFREQUENCY DEVICE

(71) Applicants: COMMISSARIAT A L'ENERGIE ATOMIQUE ET AUX ENERGIES ALTERNATIVES, Paris (FR); INSTITUT POLYTECHNIQUE DE GRENOBLE, Grenoble (FR); Centre national de la recherche scientifique, Paris (FR); UNIVERSITE GRENOBLE ALPES, Saint-Martin-d'Heres (FR)

(72) Inventors: Dominique Morche, Grenoble (FR); Sylvain Bourdel, Saint Martin le Vinoux (FR); Florence Podevin, Saint Pierre de Chartreuse (FR); Imadeddine Bendjeddou, Grenoble (FR)

(73) Assignees: COMMISSARIAT A L'ENERGIE ATOMIQUE ET AUX ENERGIES ALTERNATIVES, Paris (FR); INSTITUT POLYTECHNIQUE DE GRENOBLE, Grenoble (FR); CENTRE NATIONAL DE LA RECHERCHE SCIENTIFIQUE, Paris (FR); UNIVERSITE GRENOBLE ALPES, Saint-Martin-D'Heres (FR)

( * ) Notice: Subject to any disclaimer, the term of this patent is extended or adjusted under 35 U.S.C. 154(b) by 0 days.

(21) Appl. No.: 19/003,509

(22) Filed: Dec. 27, 2024

(65) Prior Publication Data

US 2025/0219636 A1 Jul. 3, 2025

(30) Foreign Application Priority Data

Dec. 27, 2023 (FR) ...................................... 2315348

(51) Int. Cl.
*H03K 17/56* (2006.01)
*H03H 7/06* (2006.01)

(52) U.S. Cl.
CPC ............... *H03K 17/56* (2013.01); *H03H 7/06* (2013.01)

(58) Field of Classification Search
CPC ................................ H03K 17/56; H03H 7/06
(Continued)

(56) References Cited

U.S. PATENT DOCUMENTS 9,014,653 B2 4/2015 Madadi et al.
11,757,477 B2 * 9/2023 Rivoirard ............ H04B 1/0096 455/552.1
2009/0315611 A1 * 12/2009 Lu ....................... H03D 7/1458 327/361

OTHER PUBLICATIONS

Kord, et al., "Microwave Nonreciprocity", Proceedings of the IEEE, vol. 108, Issue: 10, pp. 1728-1758, Oct. 2020.

(Continued)

*Primary Examiner* — Tomi Skibinski
(74) *Attorney, Agent, or Firm* — BakerHostetler

(57) ABSTRACT

An NPF radiofrequency device includes a first end terminal E1, four first branches $BR1_0$, $BR1_1$, $BR1_2$, $BR1_3$ connected to E1 and each including a capacitor, respectively $C_0$, $C_1$, $C_2$, $C_3$, having the same capacitance, including a first terminal and a second terminal connected to ground, and a switch arranged between E1 and the first terminal of the capacitor of the first branch; the device being designed to, in each first branch $BR1_i$, close the switch at each time $pT_0+(i)T_0/4$, for $T_0/4$, where p is a natural number and $T_0$ is the period of the clock signal; the device including at least two successive second branches from among an ordered set of second branches $BR2_0$, $BR2_1$, $BR2_2$, $BR2_3$, the second branch $BR2_i$ including a second end terminal $E2_i$, and each second branch $BR2_k$ of the device including, for each first (Continued)

branch, $BR1_1$, i=0 to 3, a switch between the first terminal of the capacitor $C_i$ and the second branch, the device being designed to close the switch at each $pT_0+(i+k)T_0/4$, for $T_0/4$.

9 Claims, 11 Drawing Sheets

(58) Field of Classification Search
USPC .......................................................... 327/291
See application file for complete search history.

(56) References Cited

OTHER PUBLICATIONS

Liu, et al., "A 2.4-mW interference-resilient receiver front end with series N-path filter-based balun for body channel communication", International Journal of Circuit Theory and Applications, vol. 46, No. 11, pp. 2118-2133, 2018.
Martin, "Complex signal processing is not complex", IEEE Transactions on Circuits and Systems I: Regular Papers, vol. 51, Issue: 9, pp. 1823-1836, Sep. 2004.
Kaukovuori, et al., «Analysis and Design of Passive Polyphase Filters», IEEE Transactions on Circuits and Systems I: Regular Papers, vol. 55, No. 10, pp. 3023-3037, Nov. 2008.

* cited by examiner

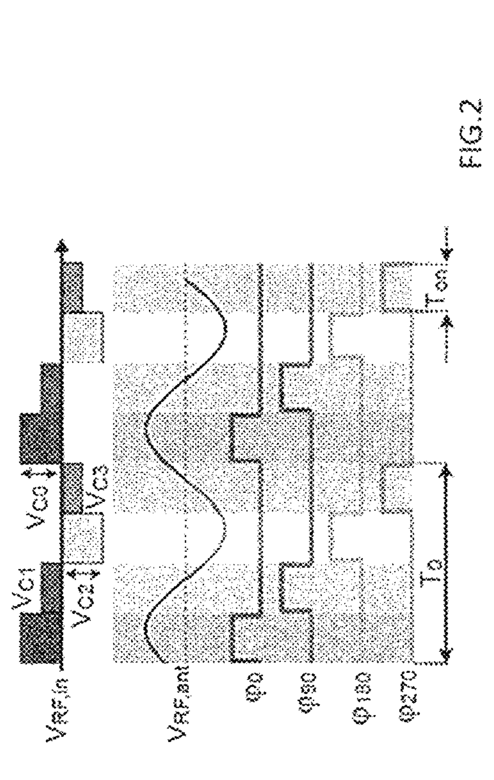
FIG.2
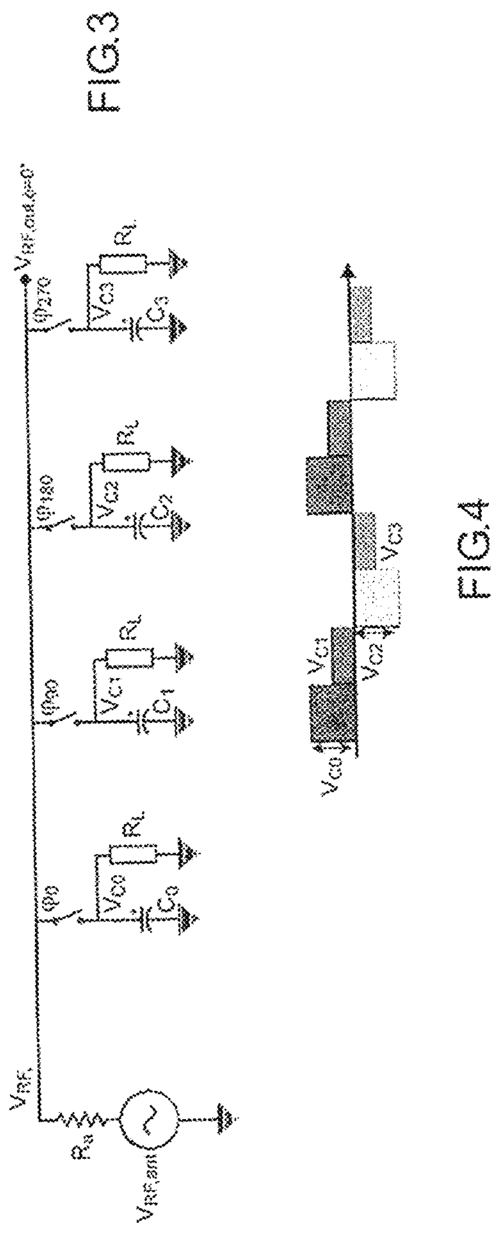
FIG.3
FIG.4

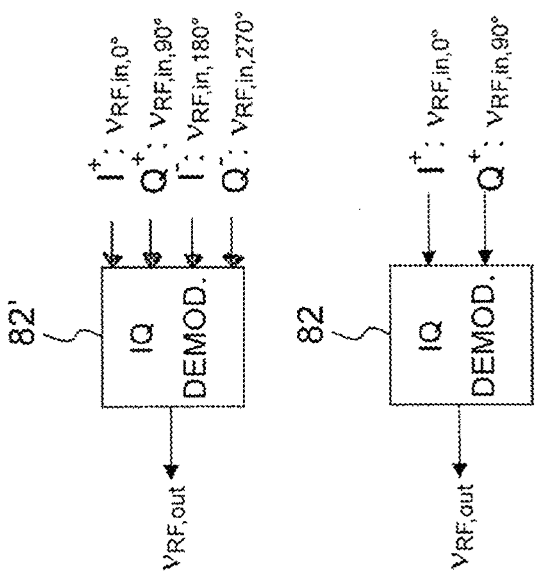
FIG.11
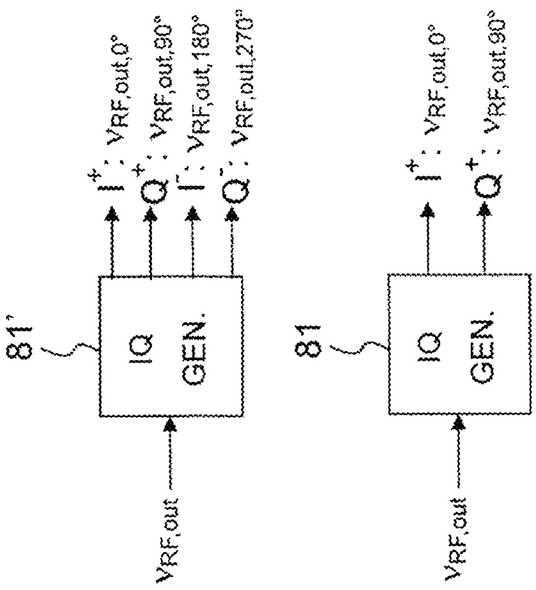

NPF RADIOFREQUENCY DEVICE

CROSS-REFERENCE TO RELATED APPLICATION

This application claims priority to foreign French patent application No. FR 2315348, filed on Dec. 27, 2023, the disclosure of which is incorporated by reference in its entirety.

FIELD OF THE INVENTION

The invention lies in the field of differential IQ generator devices (or differential IQ combiners) at radiofrequency (RF) frequencies, that is to say for example 0.1-5 GHz or above.

BACKGROUND

As is known and illustrated in the left-hand part of FIG. 11, the typical function of an IQ generator is as follows: an IQ generator receives an input signal, $V_{RF,ant}$ and makes it possible to obtain, at output, two quadrature signals (complex signals, providing a complex representation of the input signal), referred to as $I^+$ and $Q^+$, of the same frequency and phase shifted by 90°: $I^+=V_{RF,out,0°}$ and $Q^+=V_{RF,out,90°}$ (typical generator 81) or four signals in the case of a differential IQ generator with, in addition, $I^-=-V_{RF,out,0°}=V_{RF,out,180°}$ and $Q^-=-V_{RF,out,90°}=V_{RF,out,270°}$ (typical generator 81').

Reciprocally, the function of such a device may be reversed, by exchanging one or more inputs and outputs: this then gives a typical IQ combiner 82 (possibly typical differential IQ combiner 82') as illustrated in the right-hand part of FIG. 11. Such an IQ combiner receives, as inputs, two quadrature signals of the same frequency and phase shifted by 90° (complex signals): $I^+=V_{RF,in,0°}$ and $Q^+=V_{RF,in,90°}$ (combiner 82) or four signals in the case of the differential IQ combiner with, in addition, $I''=-V_{RF,in,0°}=V_{RF,in,180°}$ and $Q^-=-V_{RF,in,90°}=V_{RF,in,270°}$ (combiner 82'), combines them and delivers the signal $V_{RF,out}$.

J. Kaukovuori, K. Stadius, J. Ryynanen, and K. A. I. Halonen, "Analysis and Design of Passive Polyphase Filters", IEEE Transactions on Circuits and Systems I: Regular Papers, vol. 55, no 10, p. 3023-3307, November 2008, doi: 10.1109/TCSI.2008.917990, proposes, as shown in FIG. 1, two polyphase filters, PPF-I and PPF-II, for generating differential I and Q quadrature signals ($I^+$, $I^-$, $Q^+$, $Q^-$). Each of the filters has 4 paths.

However, these PPF architectures have the following drawbacks:

- they have little or no frequency selectivity of the processed radiofrequency signal, thereby making the associated receivers sensitive to blockers in the case where the input signal is the signal received by an RF receiver;
- they are not frequency agile;
- they are bulky;
- they theoretically exhibit at least 3 dB of losses between the RF input and the I, Q outputs.

There is therefore a need to have IQ generators (or IQ combiners), notably differential ones, at RF frequencies (0.1-5 GHz and above) that do not exhibit these drawbacks.

SUMMARY OF THE INVENTION

To this end, according to a first aspect, the present invention describes a radiofrequency IQ quadrature signal generator device comprising a first end terminal, four first branches called $BR1_0$, $BR1_1$, $BR1_2$, $BR1_3$ connected to said first end terminal,

- each first branch comprises a capacitor, respectively $C_0$, $C_1$, $C_2$, $C_3$, having the same capacitance, comprising a first terminal and a second terminal, said second terminal of the capacitor being connected to ground and a switch arranged between the first end terminal and the first terminal of the capacitor of said first branch;
- said device being designed to, in each first branch $BR1_i$, close the switch at each time $pT_0+(i)T_0/4$, for a time interval $T_0/4$, where p is a natural number and $T_0$ is the period of the clock signal;
- said device being characterized in that:
- the NPF device comprises at least one pair of second branches comprising two successive second branches in a cyclic ordered list of four second branches $BR2_0$, $BR2_1$, $BR2_2$, $BR2_3$, the second branch $BR2_k$ comprising a second end terminal $E2_k$, and
- each second branch $BR2_k$ of the device comprises, for each first branch, $BR1_i$, i=0 to 3, a switch between the first terminal of the capacitor $C_i$ of said first branch and said second branch, said device being designed to close said switch at each time $pT_0+(i+k)T_0/4$, for a time interval $T_0/4$;
- said radiofrequency IQ quadrature signal generator device being designed to receive, at input, an input signal of frequency $f_{RF}$ on said first end terminal, to generate at least two quadrature signals, of frequency $f_{RF}$, from the input signal and to deliver them, at output, on the second end terminals of said pair of second branches;
- said second end terminals of the second branches of said pair being distinct from said first end terminal,
- the frequencies $f_{RF}$ and $1/T_0$ being substantially equal;
- for each second terminal of the device: the signal delivered at output on said second terminal of the device is linked to the input signal by a transfer function comprising a filter function and a phase shift function.

The invention is thus based on the use of a base of what are known as N-path filters (NPF), corresponding to N parallel capacitors switched by clock signals with a duty cycle 1/N. The NPF architecture generates (or conversely combines) N amplitude-balanced signals, with a period $T_0$, delayed with respect to one another by $T_0/N$. The architecture reduces losses: approximately 1.8 dB per path (compared to 3 dB of losses per path in PPF-I and PPF-II filters) and naturally offers frequency filtering with a high quality factor.

It does not require any resistors or inductors, thereby reducing bulk compared to phase shifters from the prior art.

In some embodiments, such a device comprises four second branches $BR2_0$, $BR2_1$, $BR2_2$, $BR2_3$ each comprising a second end terminal $E2_0$, $E2_1$, $E2_2$ and $E2_3$, respectively, and

- each second branch $BR2_k$, k=0 to 3, comprises, for each first branch, $BR1_i$, i=0 to 3, a switch between the first terminal of the capacitor $C_i$ of said first branch and said second branch, said device being designed to close said switch at each time $pT_0+(i+k)T_0/4$, for a time interval $T_0/4$,
- said device being designed to receive an input signal of frequency $f_{RF}$ on said first end terminal (E1) and to generate four quadrature signals in differential form, $I^+$, $I^-$, $Q^+$, $Q^-$, delivered on the second end terminal $E2_0$, $E2_2$, $E2_1$, $E2_3$, each of frequency $f_{RF}$,
- said second end terminals $E2_0$, $E2_1$, $E2_2$ and $E2_3$ being distinct from said first end terminal;

it furthermore comprises a complex filter, the transfer function of which is not symmetrical about zero, and at the input of which the signals delivered to the second end terminals are supplied at the input of said complex filter.

According to another aspect, the invention describes a method for generating IQ signals using said device according to the first aspect of the invention, said method comprising the following steps:

- applying an input signal to said first end terminal,
- obtaining at least two quadrature signals on the second end terminals of at least said two successive second branches.

In one embodiment, this generation method using said device according to the first aspect of the invention in the indicated configuration in which it comprises four second branches $BR2_0$, $BR2_1$, $BR2_2$, $BR2_3$ comprises the following steps:

- applying an input signal to said first end terminal,
- obtaining the differential signal $I^+$, respectively $I^-$, $Q^+$, $Q^-$, on the second end terminal $E2_0$, respectively $E2_2$, $E2_1$, $E2_3$.

According to another aspect, the invention proposes a method for combining quadrature IQ signals using the device according to the first aspect of the invention, said method comprising the following steps:

- applying two quadrature signals, one to the second end terminal of one of the two successive second branches, the other to the second end terminal of the other of the two successive second branches;
- obtaining a signal resulting from the combination of said quadrature signals on said first end terminal.

In one embodiment, this generation method using said device according to the first aspect of the invention in the indicated configuration in which it comprises four second branches $BR2_0$, $BR2_1$, $BR2_2$, $BR2_3$ comprises the following steps:

- applying the differential signal $I^+$, respectively $I^-$, $Q^+$, $Q^-$, to the second end terminal $E2_0$, respectively $E2_2$, $E2_1$, $E2_3$
- obtaining a signal resulting from the combination of said differential signals on said first end terminal.

According to another aspect, the invention proposes a radiofrequency IQ quadrature signal combiner device comprising a first end terminal, four first branches called $BR1_0$, $BR1_1$, $BR1_2$, $BR1_3$ connected to said first end terminal,

- each first branch comprises a capacitor, respectively $C_0$, $C_1$, $C_2$, $C_3$, having the same capacitance, comprising a first terminal and a second terminal, said second terminal of the capacitor being connected to ground and a switch arranged between the first end terminal and the first terminal of the capacitor of said first branch;
- said device being designed to, in each first branch $BR1_i$, close the switch at each time $pT_0$+ $(i)T_0/4$, for a time interval $T_0/4$, where p is a natural number and $T_0$ is the period of the clock signal;
- said radiofrequency IQ quadrature signal combiner device being characterized in that:
- the device is an NPF device and comprises at least one pair of second branches comprising two successive branches in a cyclic ordered list of second branches $BR2_0$, $BR2_1$, $BR2_2$, $BR2_3$, the second branch $BR2_k$ comprising a second end terminal $E2_k$, and
- each second branch $BR2_k$ of the device comprises, for each first branch, $BR1_i$, i=0 to 3, a switch between the first terminal of the capacitor $C_i$ of said first branch and said second branch, said device being designed to close said switch at each time $pT_0+(i+k)T_0/4$, for a time interval $T_0/4$;
- said device being designed to receive, at input, at least two quadrature signals of frequency $f_{RF}$, one on the second end terminal of one of the second branches of said pair of second branches, the other on the second end terminal of the other of the second branches of said pair of second branches, to combine them and to deliver, at output, on said first end terminal, a signal of frequency $f_{RF}$ resulting from the combination of said quadrature signals;
- said second end terminals of the second branches of said pair being distinct from said first end terminal;
- the frequencies $f_{RF}$ and $1/T_0$ being substantially equal;
- each signal received at input on a second terminal of said pair being linked to the signal delivered at output on the first terminal by a transfer function comprising a filter function and a phase shift function.

In one embodiment, such a device comprises four second branches $BR2_0$, $BR2_1$, $BR2_2$, $BR2_3$ each comprising a second end terminal $E2_0$, $E2_1$, $E2_2$ and $E2_3$, respectively, and

- each second branch $BR2_k$, k=0 to 3, comprises, for each first branch, $BR1_i$, i=0 to 3, a switch between the first terminal of the capacitor $C_i$ of said first branch and said second branch, said device being designed to close said switch at each time $pT_0$+ $(i+k)T_0/4$, for a time interval $T_0/4$,
- said device being designed to receive, at input, four quadrature signals in differential form, $I^+$, $I^-$, $Q^+$, $Q^-$, of frequency $f_{RF}$, on the second end terminals $E2_0$, $E2_2$, $E2_1$, $E2_3$, to combine them and to deliver, at output, a signal of frequency $f_{RF}$ resulting from the combination of said differential signals on said first end terminal;
- said second end terminals $E2_0$, $E2_1$, $E2_2$ and $E2_3$ being distinct from said first end terminal,
- each signal received at input on a second terminal of said pair being linked to the signal delivered at output on the first terminal by a transfer function comprising a filter function and a phase shift function.

According to another aspect, the invention proposes a method for combining quadrature IQ signals using the radiofrequency IQ quadrature signal combiner device (10) according to the invention, said method comprising the following steps:

- applying, at the input of the device, two quadrature signals of frequency $f_{RF}$, one to the second end terminal of one of the second branches of said pair, the other to the second end terminal of the other of the second branches of said pair;
- obtaining, at the output of the device, a signal of frequency $f_{RF}$ resulting from the combination of said quadrature signals on said first end terminal.

In one embodiment, such a method comprises the following steps:

- applying, at the input of the device, four quadrature differential signals $I^+$, $I^-$, $Q^+$, $Q^-$ to the second end terminals $E2_0$, $E2_2$, $E2_1$, $E2_3$, each of said signals being of frequency $f_{RF}$;
- obtaining, at output, on said first end terminal, a signal of frequency $f_{RF}$ resulting from the combination of said differential signals.

BRIEF DESCRIPTION OF THE DRAWINGS

The invention will be better understood and other features, details and advantages will become more clearly apparent on reading the non-limiting description that follows, and by virtue of the appended figures, which are given by way of example.

FIG. 2 is a timing diagram of the electrical signals implemented in an NPF of the type shown in FIG. 3;

FIG. 3 is a diagram of an architecture of a conventional N-path filter-N-path mixer;

FIG. 4 is a timing diagram of the signal $V_{RF,out,\phi=0^\circ}$ in an NPF of the type shown in FIG. 3;

FIG. 11 schematically shows an IQ generator, a differential IQ generator, an IQ combiner and a differential IQ combiner;

Figure 1:
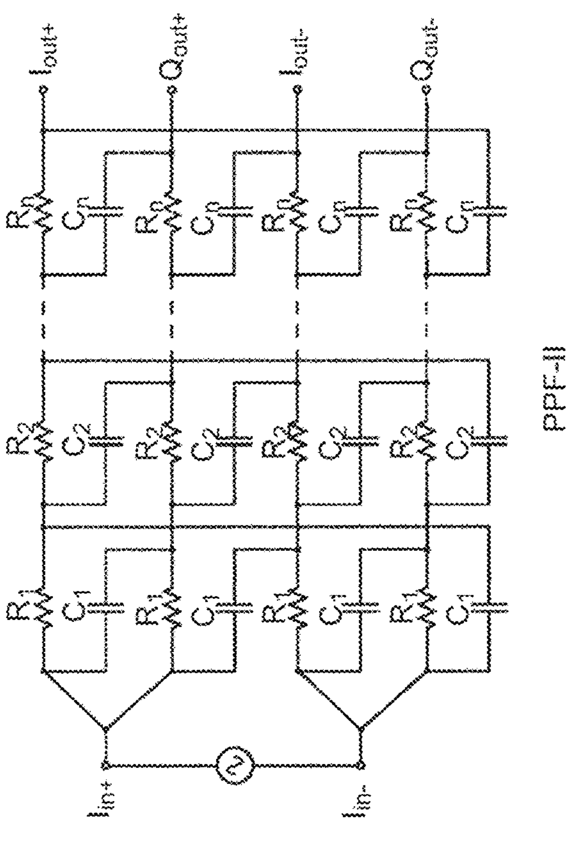
FIG. 1 contains diagrams of polyphase filters from the prior art for generating IQ signals.
Figure 1:
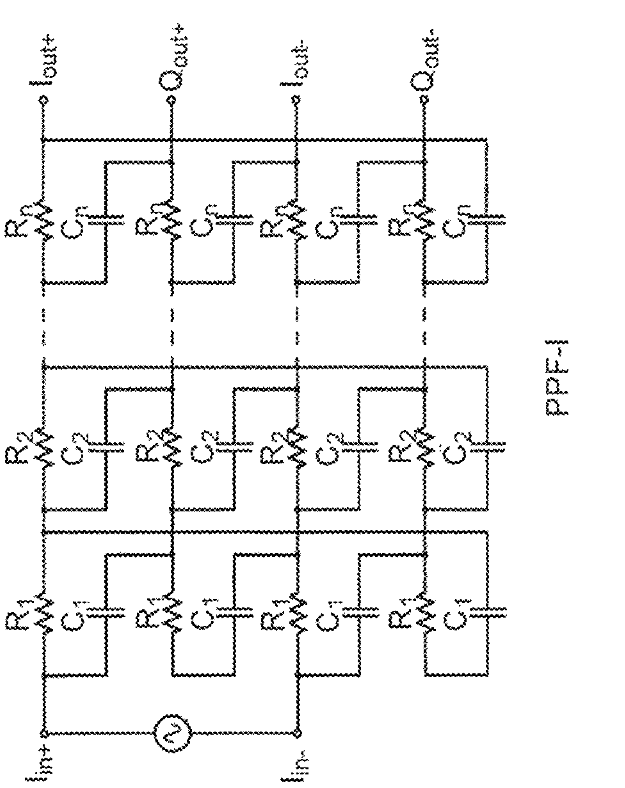

Identical references may be used in various figures to designate identical or comparable elements.

DETAILED DESCRIPTION

Preamble regarding N-path filters NPF

In the preamble, a few general features regarding N-path filters NPF will first be presented.

FIGS. 2, 3, 4 and 5 relate to a conventional NPF architecture.

In these figures, the source signal, for example from an antenna, is called $V_{RF,ant}$ and its source impedance is called Ra. The signal $V_{RF,in}$ is the one located after the impedance Ra with respect to the antenna. The input impedance equivalent to the circuit is denoted $Z_{in}$. It will be seen in FIGS. 2 to 5 that $V_{RF,out}=V_{RF,in}$.

An NPF filter is an electronic circuit that uses N paths, which are embodied by an identical number N of capacitors so as to improve the rejection of unwanted signals. It is often used in RF to reduce the impact of interference due to blockers.

More specifically, FIG. 3 is a diagram of an N-path filter-N-path mixer architecture.

FIGS. 2, 3 and 4 illustrate the case N=4, with the signal $V_{RF,ant}=A(t)\cos(\omega_{RF}t+\varphi(t))$, A(t) and φ(t) modelling amplitude modulation and phase modulation, respectively. For the sake of simplicity, it is chosen hereinafter to adopt A(t)=A, which is constant, and φ(t)=0° in the representations; since modulations are slow phenomena, this does not impact the theory. @RF is the angular frequency of the radiofrequency signal; $\omega_{RF}=2\pi f_{RF}$ where $f_{RF}$ is the frequency of the radiofrequency signal. The NPF filter consists in sampling, for a period $T_0/N$, the signal $V_{RF,in}$ on each of the paths so as to charge the corresponding capacitor only during this time interval. The action is repeated on each of the N paths with a delay between the control signals for the samplers (switches, commutators) of $T_0/N$. If @RF is close to $\omega_0=2\pi f_0=2\pi/T_0$, then the signal is in the passband of the filter, where $f_0$ is the fundamental frequency of the control signal of period $T_0$ and $\omega_0$ is the corresponding angular frequency. Here, "close" is understood to mean when the distance between the values is less than half the passband of the N-path filter defined below (for example based on the transfer function defined in paragraph 114). $T_{on}$ is the on time of the clock over one phase.

With respect to FIGS. 2 to 4: the control signal for the sampler intended to be supplied to the capacitor referenced $C_0$ is called $\varphi_0$; the control signal for the sampler intended to be supplied to the capacitor referenced $C_1$ is called $\varphi_{90}$; the control signal for the sampler intended to be supplied to the capacitor referenced $C_2$ is called $\omega_{180}$; the control signal for the sampler intended to be supplied to the capacitor referenced $C_3$ is called $\omega_{270}$.

Across the terminals of each capacitor $C_i$ there is a voltage signal, $V_{Ci}$, said to be at intermediate frequency FI with an angular frequency $\omega_{FI}=|\omega_{RF}-\omega_0|$. For this reason, NPF filters that naturally provide a mixing function may be used as N-path mixer (NPM) in the literature.

Figure 5:
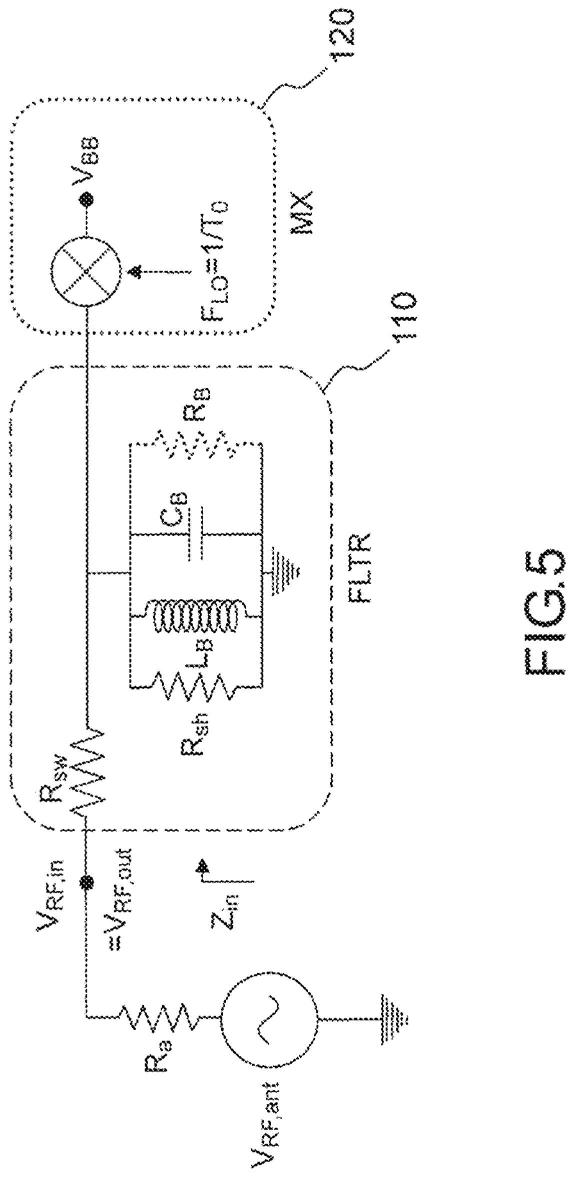
FIG. 5 models the circuit of FIG. 8.

FIG. 2 is a timing diagram of the electrical signals ($V_{RF,in}$, $V_{RF,ant}$, and the respective control signals $\varphi_0$, $\varphi_{90}$, $\varphi_{180}$, $\varphi_{270}$ for the switches) implemented in an NPF of the type shown in FIG. 3, and FIG. 4 is a timing diagram of the signal $V_{RF,out,\phi=0^\circ}$ in an NPF circuit of the type shown in FIG. 3. It may be clearly seen that $V_{RF,out,\phi=0^\circ}=V_{RF,in}$ The equivalent circuit diagram of such a circuit is shown in FIG. 5, differentiating the two functions inherent to the circuit of FIG. 3: filtering function (corresponding to the block FLTR 110) and mixing function (corresponding substantially to the block MX 120).

For the mixing function, a signal of angular frequency $\omega_{FI}$ and amplitude-modulated and phase-modulated by A(t) and φ(t) is found on the node $V_{BB}$. $V_{BB}$ indifferently represents (that is to say whatever the value of i) the voltage $V_{Ci}$ across the terminals of the capacitor $C_i$.

For the filtering function, the ratio $$A_{V,RF}(f_{RF}) = \frac{V_{RF,out}(f_{RF})}{V_{RF,ant}(f_{RF})}$$

is what is of interest.

The data in the equivalent circuit diagram at the frequency $f_{RF}$ close to the clock frequency of the switches are as follows:

$R_B=\gamma_N R_L$, the dynamic resistance equivalent to the N parallel paths, with $R_L$ the low-frequency load resistance (example: that of a measuring amplifier), where $$\gamma_N = \frac{1}{N}\operatorname{sinc}^2\left(\frac{\pi}{N}\right)$$

$Z_{in}$ is the input impedance of the circuit at the RF frequency seen from the antenna $$Z_{in} = R_{sw} + R_B \| R_{sh} (\| \text{ signifies "in parallel"})$$

where $R_{sh}$ represents the power losses associated with $R_\alpha$ and $R_{sw}$ due to up-conversion and down-conversion of signal harmonics $$R_{sh} = \alpha_N(R_a + R_{sw})$$

where $$\alpha_N = \frac{N \cdot \gamma_N}{1 - N \cdot \gamma_N}$$

with $R_{sw}$ the resistance of the switch and $R_\alpha$ the resistance of the source (or antenna resistance)

$$C_B = \frac{C_i}{2\gamma_N} = \frac{C_L}{2\gamma_N},$$

the dynamic capacitance equivalent to the N capacitors $C_i$ in parallel. Whatever the value of i, $C_i = C_L$ such that $2R_BC_B = R_L C_L$ $$L_B = \frac{1}{(2\pi f_0)^2 C_B},$$

the equivalent dynamic inductance of the filtering function $$V_{Ci} = A(t)\cos\left(\varphi(t) + \frac{2\pi(i-1)}{N}\right)\text{sinc}\left(\frac{\pi}{N}\right),$$

the voltage across the terminals of the capacitor $C_i$, φ(t) and A(t) being, as a reminder, slowly variable modulation functions. (FIG. 3).

This then results in the following amplitude filtering function, which naturally has a high quality factor:

$$|A_{V,RF}(f_{RF})| = \left|\frac{V_{RF,out}(f_{RF})}{V_{RF,ant}(f_{RF})}\right| = \left|\frac{Z_{in}}{Z_{in} + R_a}\right| = \left|\frac{Z_B + R_{sw}}{Z_B + R_{sw} + R_a}\right|$$

$$\text{with } Z_B = \frac{j\omega_{RF}L_B}{1 + (j\omega_{RF})^2 L_B C_B + j\omega_{RF}L_B/(R_{sh}\|R_B)}$$

One particular case is that where $R_L$ is chosen so as to have matching at input:

$$R_L = R_{L\_match} = R_a \frac{1}{\gamma_N} \frac{\alpha_N \cdot (1+\rho)(1-\rho)}{\alpha_N \cdot (1+\rho) - (1-\rho)} \text{ with } \rho = \frac{R_{sw}}{R_a}.$$

The NPF-based structure will always have its filtering characteristic with a particular value for $$R_B = R_{B\_match} = \frac{R_{sh}(R_a + R_{sw})}{R_{sh} - (R_a + R_{sw})}.$$

The Invention

The invention lies in the context of N-path filters. It proposes an NPF architecture generating 4 signals that are sampled, of period $T_0$, delayed with respect to one another by $T_0/4$, and amplitude-balanced.

Reciprocally, the invention also makes it possible to address the inverse problem, namely to combine 4 periodic signals of period $T_0$ that are phase-shifted with respect to one another by $T_0/4$, and amplitude-balanced.

Figure 6:
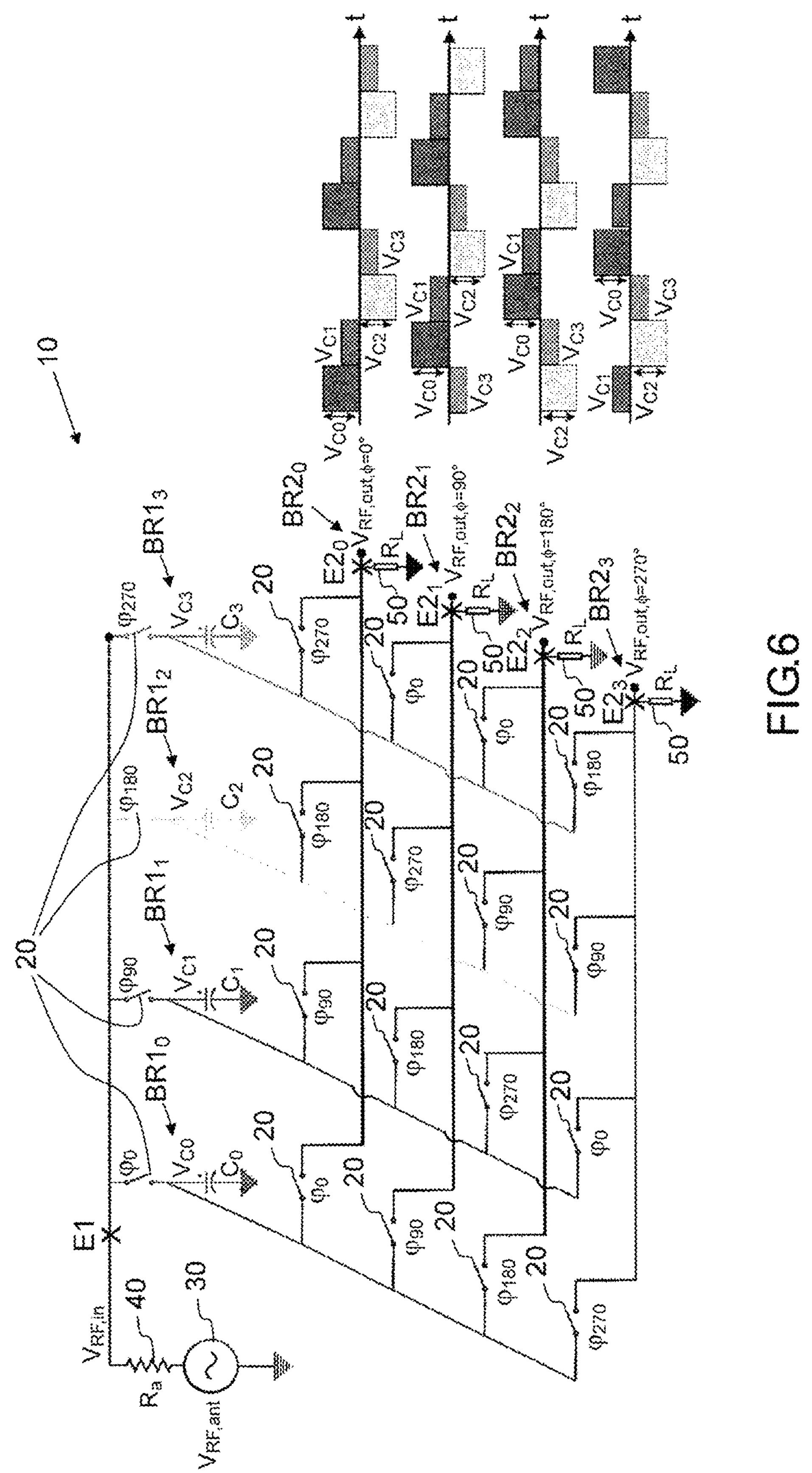
FIG. 6 shows an NPF device in one embodiment of the invention, designed to generate and/or combine differential I, Q signals.

FIG. 6 shows an architecture of a 4-path NPF device 10 in one embodiment of the invention, which makes it possible to generate and combine differential IQ signals.

The NPF device 10 comprises a first end terminal, E1, and four first parallel branches, $BR1_0$, $BR1_1$, $BR1_2$, $BR1_3$, each connected to E1. The input voltage of the device, $V_{RF,in}$, is applied to E1 and therefore across the terminals of each of these four branches.

Each of these branches $BR1_i$ comprises a switch (or commutator) 20 and a capacitor $C_i$, of value $C_L$ (identical for the four capacitors), i=0 to 3: one terminal of this switch 20 is brought to the voltage $V_{RF,in}$, and the other terminal of the switch is connected to a first terminal of this capacitor. The second terminal of the capacitor is connected to ground.

The switch 20 connected to the capacitor $C_i$, i=0 to 3, is controlled by a control signal called $\varphi_{90x(i)}$ (i.e. $\varphi_0$ for i=0, $\varphi_{90}$ for i=1, $\varphi_{180}$ for i=2, $\varphi_{270}$ for i=3) that causes it to close at each time $pT_0 + (i)T_0/4$ and to do so for a time interval $T_0/4$, where p is a natural number varying from 0 to P, the switch being open otherwise. $P \times T_0$ is the operating time of the device, which may reach for example several minutes (more than Feb. 5, 2010 min for example) and $T_0$ adopts variable values, for example notably in a range of 0.04 to 10 μs.

The NPF device 10 therefore has 4 paths: indeed, it comprises four capacitors $C_i$, i=0 to 3.

Each capacitor $C_i$ is thus selectively charged by the input signal of the device, $V_{RF,in}$, at the time $pT_0 + (i)T_0/4$, for a time interval $T_0/4$, by way of the respective switch 20 arranged upstream of each capacitor and driven by the control signal $\pi_{90x(i)}$.

The NPF device 10 comprises four second parallel branches, $BR2_k$, k=0 to 3. The resistor RL represents the load of the circuit placed at the output of the device 10.

The voltage $V_{Ci}$ across the terminals of $C_i$, i=0 to 3, is applied successively across the terminals of each of these four branches $BR2_0$, $BR2_1$, $BR2_2$, $BR2_3$ for a time interval $T_0/4$, at specific times, by way of respective switches 20 driven by the control signals $\varphi_{90x(i)}$, as described below.

The voltage, $V_{Ci}$, across the terminals of the capacitor $C_i$ is thus selectively applied to the branch $BR2_k$ at each time $pT_0 + (i+k)T_0/4$, for a time interval $T_0/4$. The corresponding control signals are indicated at the switches in FIG. 6.

The value of the voltage across the terminals of $C_i$ is read 4 times, during a time interval $T_0/4$, every $pT_0 + k\,T_0/4$ where $k \in [0; 3]$, starting, for the branch $BR2_0$, at the time $pT_0 + (i)\,T_0/4$.

The device 10 comprises 4 second end terminals, $E2_0$, $E2_1$, $E2_2$ and $E2_3$.

$V_{RF,out,\phi=0°}$ is the voltage signal on the branch $BR2_0$ (across the terminals of the resistor RL of this branch, at $E2_0$);

$V_{RF,out,\phi=90°}$ is the voltage signal on the branch $BR2_1$ (across the terminals of the resistor RL of this branch, at $E2_1$);

$V_{RF,out,\phi=180°}$ is the voltage signal on the branch BR2$_2$ (across the terminals of the resistor RL of this branch, at E2$_2$);

$V_{RF,out,\phi=270°}$ is the voltage signal on the branch BR2$_3$ (across the terminals of the resistor RL of this branch, at E2$_3$);

The phase called $V_{RF,out,\phi=2k\pi/4=360°\ k/4}$ is the version delayed by $kT_0/4$ (phase delay of 360° K/4) of the signal $V_{RF,in}$, that is to say the version delayed by $kT_0/4$, and filtered and sampled, of the signal $V_{RF,ant}$.

The timing diagrams of the voltage $V_{RF,out,\phi=360°k/4}$ are shown opposite the point E2$_k$ at this voltage in FIG. 6, for k=0 to 3.

The signal $V_{RF,out,\phi_0=0°}$ is special in that it reproduces the signal $V_{RF,in}$ without a delay because the switch for transferring charge from the capacitor to $R_L$ is open at the same time as the switch for charging the capacitor. However, since the discharge time $R_L$. $C_i$=$R_L$. $C_L$ is very long compared to $T_0$ (for example more than 10 times longer), discharging the capacitor at the same time as charging it has an impact similar to discharging it for an identical duration of $T_0/4$ but without charging it during this time, this being the case for the other three signals. This has resulted in the generation of 4 signals of period $T_0$ that are sampled, delayed with respect to one another by $T_0/4$, and naturally amplitude-balanced.

The invention makes it possible to address the following specific problem: the generation of 2 signals phase-shifted by 90° (IQ generator), as shown in FIG. 11 in the form of differential signals I+, I+, Q+, Q− where:

$$I^+ = V_{RF,out,\phi=0°}$$
$$I^- = V_{RF,out,\phi=180°}$$
$$Q^+ = V_{RF,out,\phi=90°}$$
$$Q^- = V_{RF,out,\phi=270°}$$

Figure 8:
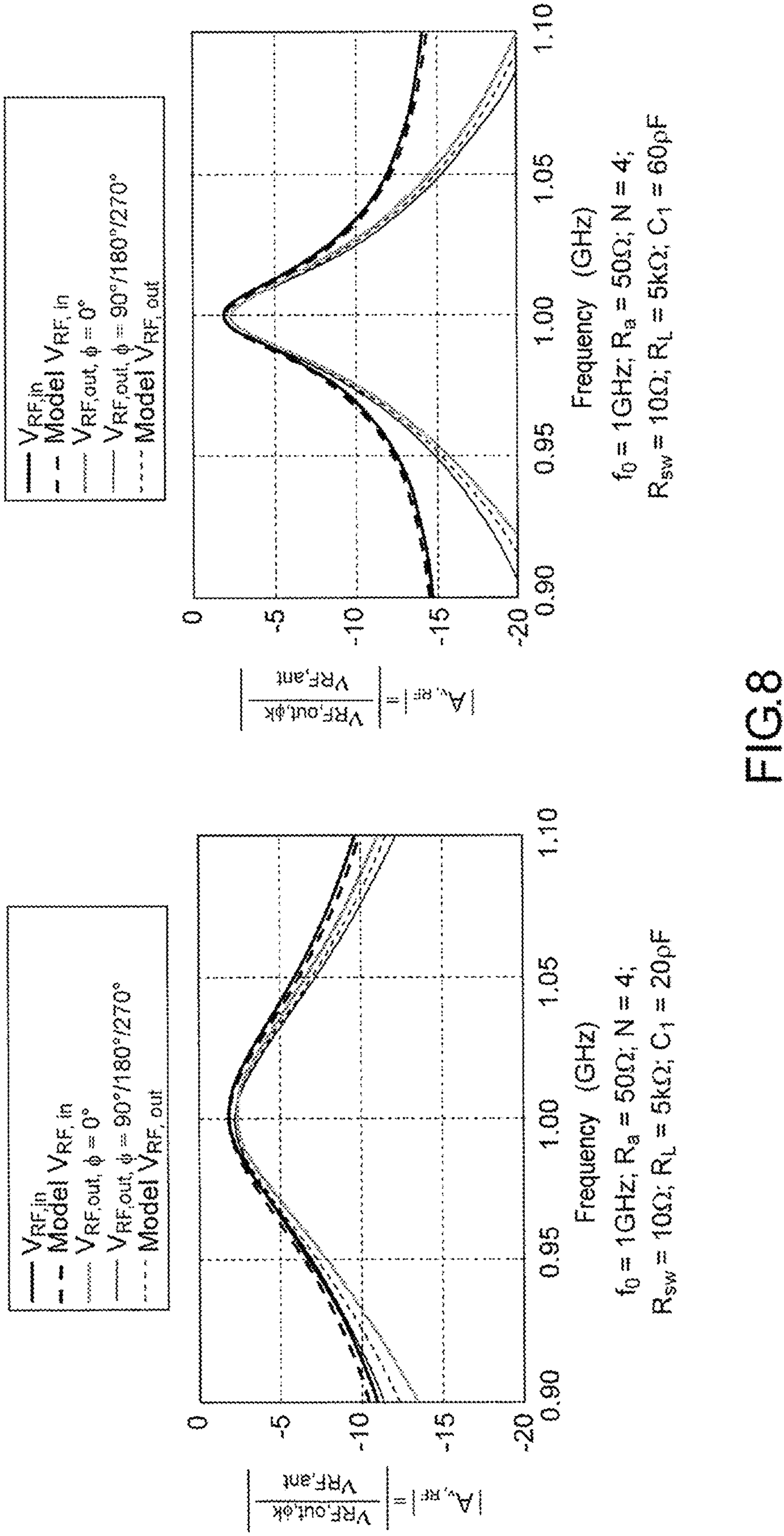
FIG. 8 is a frequency representation of 4 IQ signals generated in one embodiment of the invention.
Figure 9:
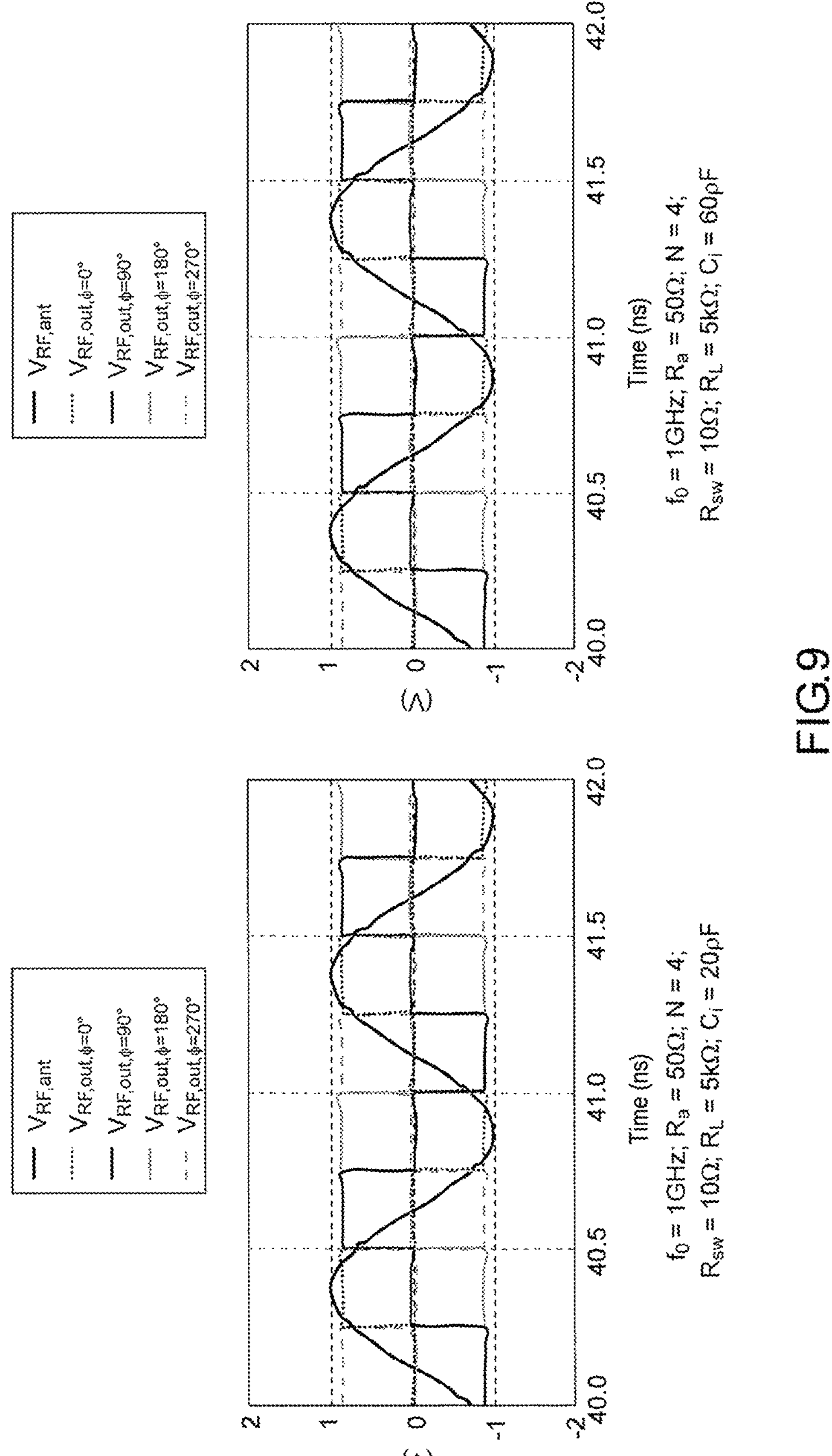
FIG. 9 is a temporal representation of differential IQ signals generated in one embodiment of the invention.

In order to validate the model, to verify the equality of the amplitude of the voltage gains $|A_{V,RF,\phi k}(f_{RF})|$ for $\phi$=0 (charge and discharge during the same cycle) and $\phi\neq0$ (charge and discharge during a different cycle), as well as the equal distribution of delays, two cases were studied as a function of capacitance $C_i$ and are illustrated in FIGS. 8 and 9, for which the outputs $V_{RF,out,\phi k}$ ($f_{RF}$) are loaded by a high impedance $R_L$=100 kΩ. The values of the parameters are explained in a key.

FIG. 8 is a frequency representation of 4 IQ signals generated in one embodiment of the invention, revealing the balancing of amplitudes and filtering properties: the 4 output phases are well balanced around the center frequency of the filter. As with NPFs, the filtering properties are linked to the value of the capacitor $C_i$=$C_L$.

FIG. 9 is a temporal representation of 2 differential IQ signals generated by the invention, showing the balancing of the delays on the timing diagrams: the 4 output phases indeed have a delay of $$\frac{T_0}{4}$$

with respect to one another, corresponding to a phase shift of 90°. The following differential signals I and Q are thus found:

$$I^+ = V_{RF,out,\phi=0°}$$
$$I^- = V_{RF,out,\phi=180°}$$
$$Q^+ = V_{RF,out,\phi=90°}$$
$$Q^- = V_{RF,out,\phi=270°}.$$

Figure 7:
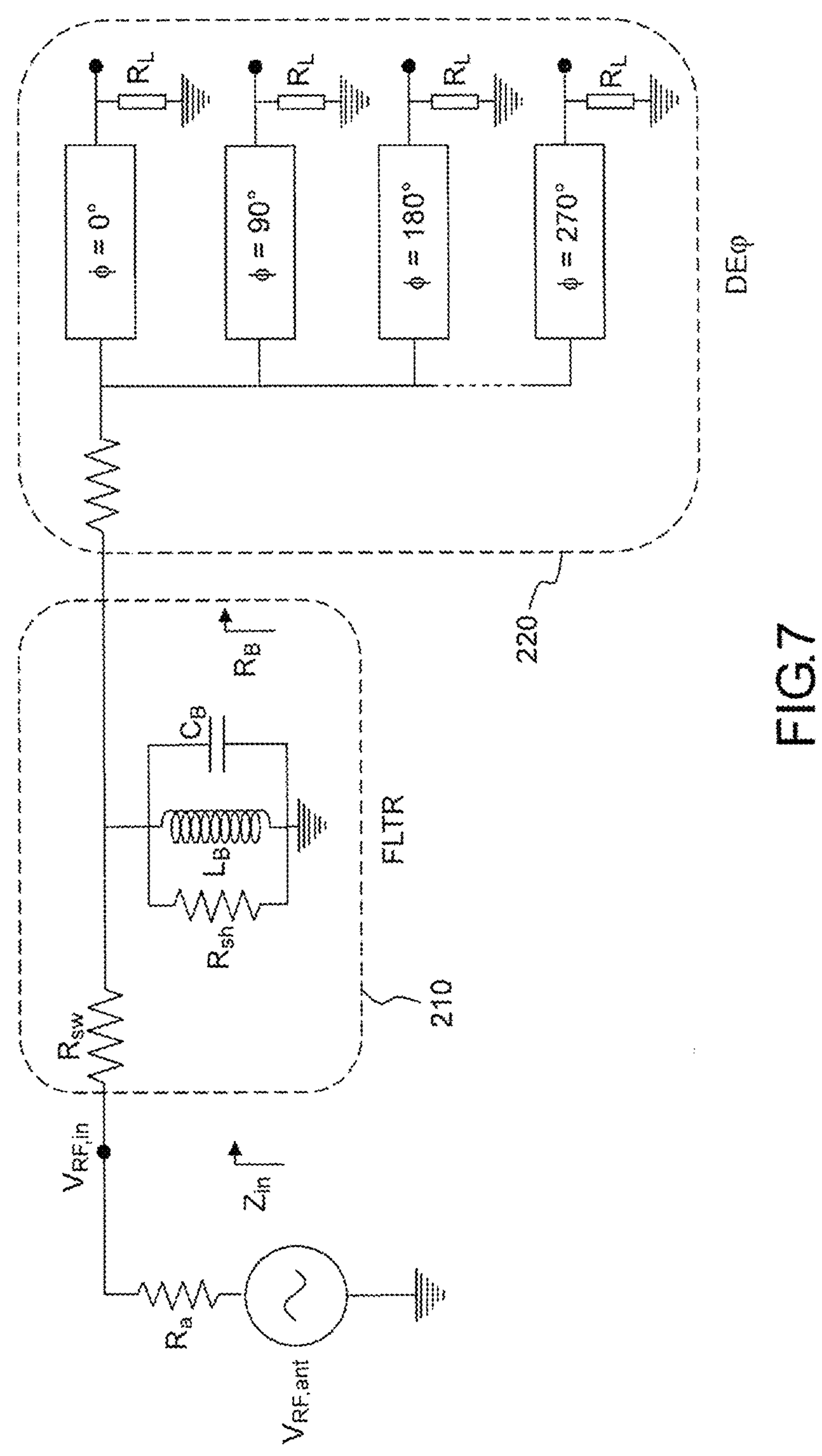
FIG. 7 is an equivalent circuit diagram of the NPF device of FIG. 6.

The equivalent circuit diagram of such a circuit is shown in FIG. 7, differentiating the two filtering (block FLTR 210) and phase shift (block DEφ 220) functions inherent to the circuit of FIG. 6.

For the phase shift function, the ratio $$A_{V,RF,\phi_k}(f_{RF}) = \frac{V_{RF,out,\phi_k}(f_{RF})}{V_{RF,ant}(f_{RF})} = \frac{V_{RF,out,\phi_k}(f_{RF})}{V_{RF,in}(f_{RF})} \cdot \frac{V_{RF,in,\phi_k}(f_{RF})}{V_{RF,ant}(f_{RF})},$$

which naturally integrates the filtering properties of the NPF, is what is of interest.

The data in the equivalent circuit diagram are as follows:

$R_B=\gamma_N R_L'$, the resistance equivalent to the N (with N=4) phase-shifted paths in parallel.

where $R_L'=R_L+R_{sw}$ is the sum of the low-frequency load resistance (example: that of a measuring amplifier) and the resistance $R_{sw}$ of each of the switches located after the capacitor.

$$\gamma_N = \frac{1}{N} sinc^2\left(\frac{\pi}{N}\right)$$

where $Z_{in}$ is the input impedance of the circuit at the RF frequency seen from the antenna $$Z_{in} = R_{sw} + R_B \parallel R_{sh}$$

where $R_{sh}$ represents the power losses associated with $R_\alpha$ and $R_{sw}$ due to up-conversion and down-conversion of signal harmonics $$R_{sh} = \alpha_N (R_a + R_{sw})$$

where $$\alpha_N = \frac{N \cdot \gamma_N}{1 - N \cdot \gamma_N}$$

with $R_{sw}$ the resistance of the switch and $R_\alpha$ the resistance of the source (or antenna resistance)

$$C_B = \frac{c_i}{2\gamma_N} = \frac{c_L}{2\gamma_N},$$

the dynamic capacitance equivalent to the N capacitors $C_i$ in parallel. Whatever the value of i, $C_i$=$C_L$ such that $2R_BC_B=R_L'C_L$ $$L_B = \frac{1}{(2\pi f_0)^2 C_B},$$

the equivalent dynamic inductance of the filtering function $$V_{Ci} = A(t)\cos\left(\varphi(t) + \frac{2\pi(i-1)}{N}\right) sinc\left(\frac{\pi}{N}\right),$$

the voltage across the terminals of the capacitor $C_i$, φ(t) and A(t) being, as a reminder, slowly variable modulation functions (FIG. 6).

There is the following phase shift function ∀k∈[1; N=4], at the frequency $f_{RF}$ close to the clock frequency of the switches (cf. above for what close is understood to mean), i.e. these frequencies are substantially equal:

$$|A_{V,RF,\phi_k}(f_{RF})| = \left|\frac{V_{RF,out,\phi_k}(f_{RF})}{V_{RF,ant}(f_{RF})}\right| = \left|\frac{V_{RF,out,\phi_k}(f_{RF})}{V_{RF,in}(f_{RF})}\right| \cdot \left|\frac{V_{RF,in,\phi_k}(f_{RF})}{V_{RF,ant}(f_{RF})}\right|$$

$$\text{with } \left|\frac{V_{RF,in,\phi_k}(f_{RF})}{V_{RF,ant}(f_{RF})}\right| = \left|\frac{Z_{in}}{Z_{in}+R_a}\right| = \left|\frac{Z_B+R_{sw}}{Z_B+R_{sw}+R_a}\right|$$

$$\text{and } \left|\frac{V_{RF,out,\phi_k}(f_{RF})}{V_{RF,in}(f_{RF})}\right| = \left|\frac{R_L}{R_L+R_{sw}}\right| \cdot \left|\frac{Z_B}{Z_B+R_{sw}}\right|$$

$$\text{and } Z_B = \frac{j\omega_{RF}L_B}{1+(j\omega_{RF})^2 L_B C_B + j\omega_{RF}L_B/(R_{sh}\|R_B)}$$

That is to say:

$$|A_{V,RF,\phi_k}(f_{RF})| \left|\frac{V_{RF,out,\phi_k}(\omega_{RF})}{V_{RF,ant}(\omega_{RF})}\right| = \frac{R_L}{R_L+R_{sw}} \cdot \left|\frac{Z_B}{Z_B+R_{sw}+R_a}\right|$$

Figure 10:
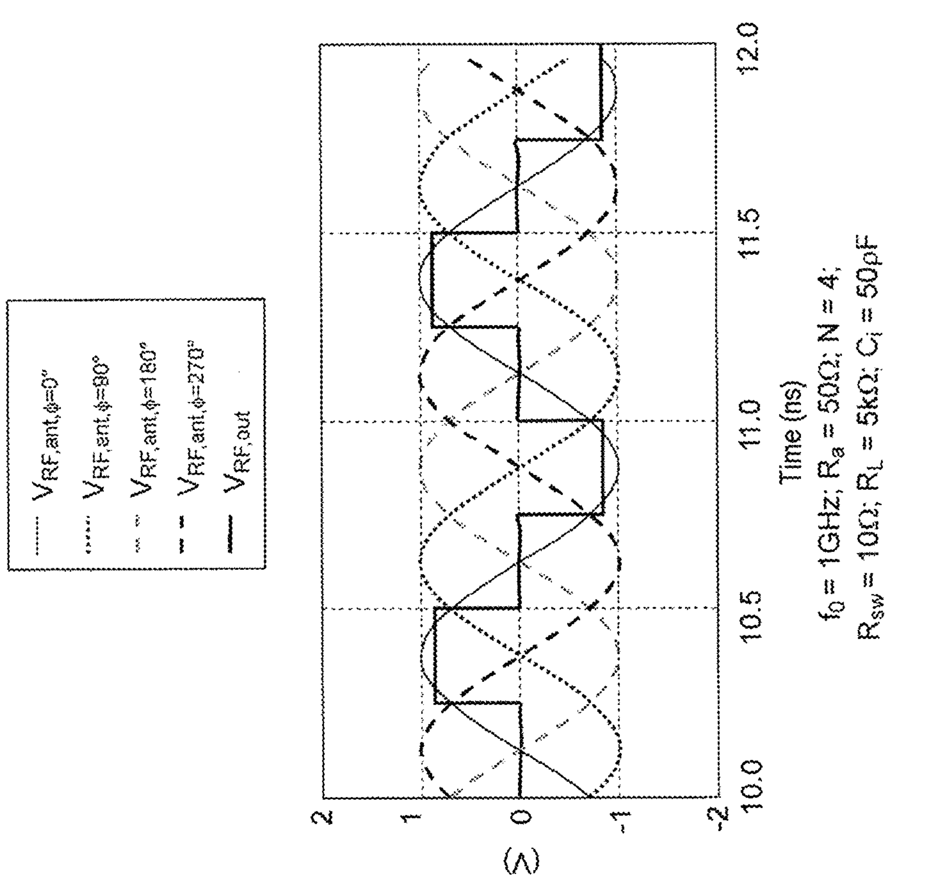
FIG. 10 is a temporal representation of differential IQ signals combined in one embodiment of the invention.

Reciprocally, the architecture as shown in FIG. 6 makes it possible to address the inverse problem: the combination of 2 quadrature differential signals (FIG. 11). The corresponding signals are shown in FIG. 10 in a case where the 4 inputs are fed by 4 antennas, of impedance $R_\alpha$=500. The output is high-impedance $R_L$=100 kΩ. The inputs are respectively:

$I^+$ on the input $V_{RF,ant,0°}$ $I^-$ on the input $V_{RF,ant,180°}$ $Q^+$ on the input $V_{RF,ant,90°}$ $Q^-$ on the input $V_{RF,ant,270°}$.

Figure 12:
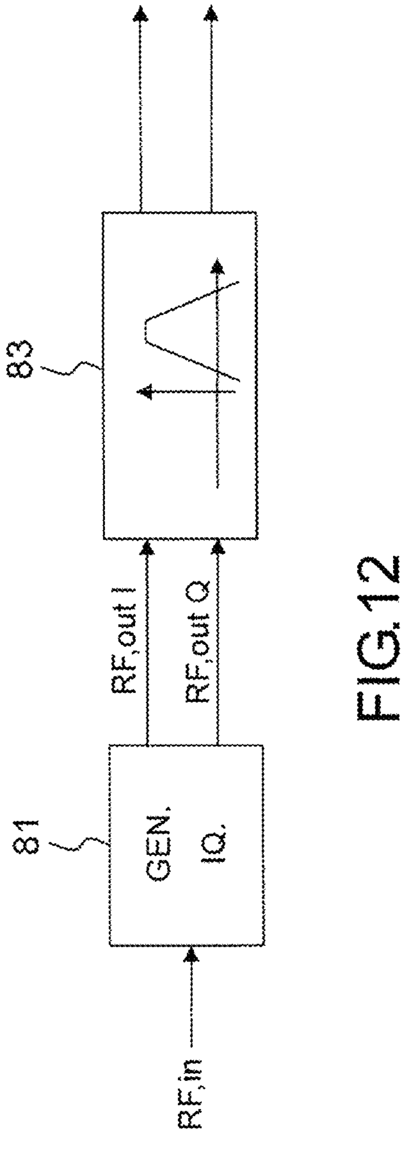
FIG. 12 illustrates a case of using an IQ generator in one embodiment of the invention.

FIG. 12 illustrates the generation of IQ signals at RF frequency in one embodiment of the invention and the use of the I and Q signals to implement a complex filter 83 (cf. K. W. Martin, "Complex signal processing is not complex," in *IEEE Transactions on Circuits and Systems I: Regular Papers*, vol. 51, no. 9, pp. 1823-1836, September 2004, doi: 10.1109/TCSI.2004.834522). The first block is an IQ signal generator implementing the typical IQ generator functions as illustrated for example by the generator 81 (or alternatively 81') of FIG. 11, and implemented according to the invention. The output signals therefore may or may not be differential. The following block 83 is a complex filter the transfer function of which is not symmetrical about zero. It may be an N-path filter or a continuous-time filter (without a clock). The advantage over a real filter is that it is easier to independently control the center frequency and the bandwidth. In addition, a complex filter may exhibit better signal rejection than a real filter.

In an IQ generator according to the invention, regardless of the configuration selected (i.e. with two output branches or four output branches), the output signals delivered on the end terminals E2$_i$ of the output branches depend on the input signal applied to the input terminal E1 and are of the same frequency as this input signal.

In an IQ generator according to the invention, regardless of the configuration selected (i.e. with two output branches or four output branches), the output terminals of the device are distinct (electrically) from the input terminal (or from the input terminals in the case of a differential input). In other words, an output terminal of the IQ generator cannot at the same time be an input terminal of the IQ generator.

Similarly, in an IQ combiner according to the invention, regardless of the configuration selected (i.e. with two input branches or with four input branches), an output terminal of the IQ combiner cannot at the same time be an input terminal of the IQ combiner.

It should be noted that, in a device according to the invention, in its IQ combiner function or in its IQ generator function, the RC constant of each of the load circuits is very large compared to $T_0/4$ (at least 10 times greater), considering here for example that the resistance of each switch of the assembly is $R_{sw}$:

$$-(R_a + R_{SW}) * C_L >> T_0;$$

$$-(R_L + R_{SW}) * C_L >> T_0;$$

Figure 13:
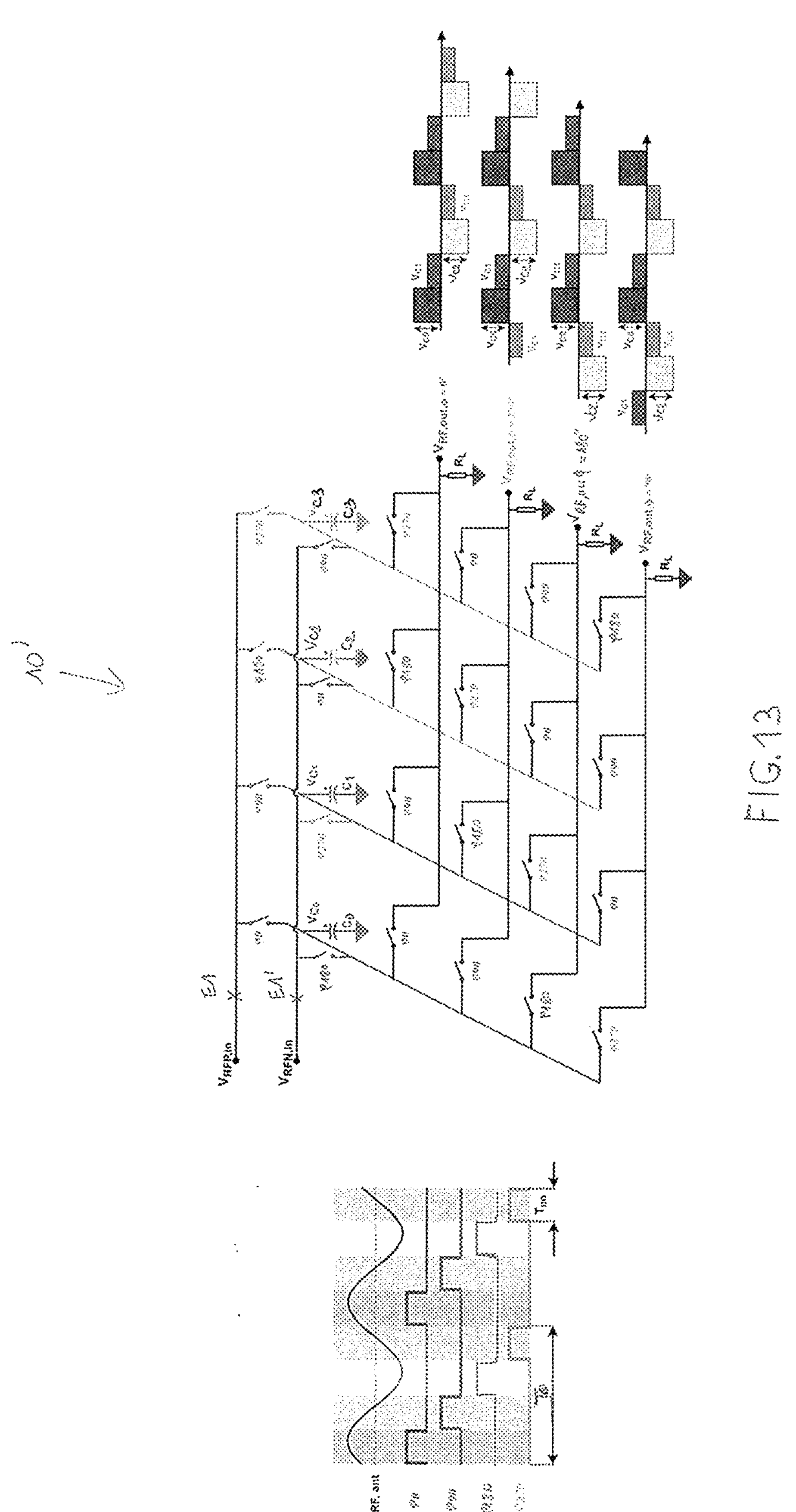
FIG. 13 shows an NPF device in one embodiment of the invention, designed to generate and/or combine differential I, Q signals, designed to receive a differential-mode signal at input.

In one embodiment, the input signal is a signal in differential form. In this case, with reference to FIG. 6, the device 10', in one embodiment of the invention, comprises notably an additional input terminal E1' and is supplemented in the manner shown in FIG. 13.

The advantages conferred by an NPF device according to the invention are notably:

- the natural frequency selectivity of the processed radiofrequency signal, inherent due to the use of an architecture based on switched capacitors;
- associated receivers that are relatively insensitive to blockers;
- an architecture that is intrinsically tuneable over a wide frequency band (typically 0.1 GHz-5 GHz), without degrading performance on this band;
- a more compact architecture;
- an architecture that limits losses on each path (1.8 dB).

The invention claimed is:

1. A radiofrequency IQ quadrature signal generator device comprising a first end terminal (E1), four first branches BR1$_0$, BR1$_1$, BR1$_2$, BR1$_3$ connected to said first end terminal, each first branch comprises a capacitor, respectively $C_0$, $C_1$, $C_2$, $C_3$, having the same capacitance, comprising a first terminal and a second terminal, said second terminal of the capacitor being connected to ground and a switch arranged between the first end terminal (E1) and the first terminal of the capacitor of said first branch;

said device being designed to, in each first branch BR1$_i$, close the switch at each time $pT_0+(i)T_0/4$, for a time interval $T_0/4$, where p is a natural number and $T_0$ is the period of the clock signal;

said device wherein:

the radiofrequency IQ quadrature signal generator device comprises at least one pair of second branches comprising two successive second branches in a cyclic ordered list of four second branches $BR2_0$, $BR2_1$, $BR2_2$, $BR2_3$, the second branch $BR2_k$ comprising a second end terminal $E2_k$, and each second branch $BR2_k$ of the device comprises, for each first branch, $BR1_i$, i=0 to 3, a switch between the first terminal of the capacitor $C_i$ of said first branch and said second branch, said device being designed to close said switch at each time $pT_0+(i+k)\ T_0/4$, for a time interval $T_0/4$;

said radiofrequency IQ quadrature signal generator device being designed to receive, at input, an input signal of frequency $f_{RF}$ on said first end terminal (E1), to generate at least two quadrature signals, of frequency $f_{RF}$, from the input signal and to deliver them, at output, on the second end terminals of said pair of second branches;

said second end terminals of the second branches of said pair being distinct from said first end terminal, the frequencies $f_{RF}$ and $1/T_0$ being substantially equal;

for each second terminal of the device: the signal delivered at output on said second terminal of the device is linked to the input signal by a transfer function comprising a filter function and a phase shift function.

2. The radiofrequency IQ quadrature signal generator device according to claim 1, comprising four second branches $BR2_0$, $BR2_1$, $BR2_2$, $BR2_3$ each comprising a second end terminal $E2_0$, $E2_1$, $E2_2$ and $E2_3$, respectively, and each second branch $BR2_k$, k=0 to 3, comprises, for each first branch, $BR1_i$, i=0 to 3, a switch between the first terminal of the capacitor $C_i$ of said first branch and said second branch, said device being designed to close said switch at each time $pT_0+(i+k)T_0/4$, for a time interval $T_0/4$, said device being designed to receive an input signal of frequency $f_{RF}$ on said first end terminal (E1) and to generate four quadrature signals in differential form, $I^+$, $I^-$, $Q^+$, $Q^-$, delivered on the second end terminal $E2_0$, $E2_2$, $E2_1$, $E2_3$, each of frequency $f_{RF}$, said second end terminals $E2_0$, $E2_1$, $E2_2$ and $E2_3$ being distinct from said first end terminal.

3. The method for generating differential IQ quadrature signals using the radiofrequency IQ quadrature signal generator device according to claim 2, said method comprising the following steps:

applying an input signal of frequency $f_{RF}$ to said first end terminal (E1), obtaining the differential signal $I^+$, respectively $I^-$, $Q^+$, $Q^-$, on the second end terminal $E2_0$, respectively $E2_2$, $E2_1$, $E2_3$, each of said signals being of frequency $f_{RF}$.

4. The radiofrequency IQ quadrature signal generator device according to claim 1, furthermore comprising a complex filter, the transfer function of which is not symmetrical about zero, and at the input of which the signals delivered to the second end terminals are supplied at the input of said complex filter.

5. A method for generating IQ quadrature signals using the radiofrequency IQ quadrature signal generator device according to claim 1, said method comprising the following steps:

applying an input signal of frequency $f_{RF}$ to said first end terminal (E1), obtaining at least two quadrature signals of frequency $f_{RF}$ on the second end terminals of said pair of second branches.

6. A radiofrequency IQ quadrature signal combiner device comprising a first end terminal (E1), four first branches called $BR1_0$, $BR1_1$, $BR1_2$, $BR1_3$ connected to said first end terminal, each first branch comprises a capacitor, respectively $C_0$, $C_1$, $C_2$, $C_3$, having the same capacitance, comprising a first terminal and a second terminal, said second terminal of the capacitor being connected to ground and a switch arranged between the first end terminal (E1) and the first terminal of the capacitor of said first branch;

said device being designed to, in each first branch $BR1_i$, close the switch at each time $pT_0+(i)T_0/4$, for a time interval $T_0/4$, where p is a natural number and $T_0$ is the period of the clock signal;

said radiofrequency IQ quadrature signal combiner device wherein:

the device is an NPF device and comprises at least one pair of second branches comprising two successive branches in a cyclic ordered list of second branches $BR2_0$, $BR2_1$, $BR2_2$, $BR2_3$, the second branch $BR2_k$ comprising a second end terminal $E2_k$, and each second branch $BR2_k$ of the device comprises, for each first branch, $BR1_i$, i=0 to 3, a switch between the first terminal of the capacitor $C_i$ of said first branch and said second branch, said device being designed to close said switch at each time $pT_0+(i+k)T_0/4$, for a time interval $T_0/4$;

said device being designed to receive, at input, at least two quadrature signals of frequency $f_{RF}$, one on the second end terminal of one of the second branches of said pair of second branches, the other on the second end terminal of the other of the second branches of said pair of second branches, to combine them and to deliver, at output, on said first end terminal (E1), a signal of frequency $f_{RF}$ resulting from the combination of said quadrature signals;

said second end terminals of the second branches of said pair being distinct from said first end terminal;

the frequencies $f_{RF}$ and $1/T_0$ being substantially equal;

each signal received at input on a second terminal of said pair being linked to the signal delivered at output on the first terminal by a transfer function comprising a filter function and a phase shift function.

7. The radiofrequency IQ quadrature signal combiner device according to claim 6, comprising four second branches $BR2_0$, $BR2_1$, $BR2_2$, $BR2_3$ each comprising a second end terminal $E2_0$, $E2_1$, $E2_2$ and $E2_3$, respectively, and each second branch $BR2_k$, k=0 to 3, comprises, for each first branch, $BR1_i$, i=0 to 3, a switch between the first terminal of the capacitor $C_i$ of said first branch and said second branch, said device being designed to close said switch at each time $pT_0+(i+k)T_0/4$, for a time interval $T_0/4$, said device being designed to receive, at input, four quadrature signals in differential form, $I^+$, $I^-$, $Q^+$, $Q^-$, of frequency $f_{RF}$, on the second end terminals $E2_0$, $E2_2$, $E2_1$, $E2_3$, to combine them and to deliver, at output, a signal of frequency $f_{RF}$ resulting from the combination of said differential signals on said first end terminal (E1); said second end terminals $E2_0$, $E2_1$, $E2_2$ and $E2_3$ being distinct from said first end terminal, each signal received at input on a second terminal of said pair being linked to the signal delivered at output on the first terminal by a transfer function comprising a filter function and a phase shift function.

8. The method for combining quadrature IQ signals using the radiofrequency IQ quadrature signal combiner device according to claim 7, said method comprising the following steps:

applying, at the input of the device, four quadrature differential signals $I^+$, $I^-$, $Q^+$, $Q^-$ to the second end terminals $E2_0$, $E2_2$, $E2_1$, $E2_3$, each of said signals being of frequency $f_{RF}$;

obtaining, at output, on said first end terminal (E1), a signal of frequency $f_{RF}$ resulting from the combination of said differential signals.

9. A method for combining quadrature IQ signals using the radiofrequency IQ quadrature signal combiner device according to claim 6, said method comprising the following steps:

applying, at the input of the device, two quadrature signals of frequency $f_{RF}$, one to the second end terminal of one of the second branches of said pair, the other to the second end terminal of the other of the second branches of said pair;

obtaining, at the output of the device, a signal of frequency $f_{RF}$ resulting from the combination of said quadrature signals on said first end terminal (E1).

* * * * *